United States Patent
Akai et al.

(10) Patent No.: US 7,391,267 B2
(45) Date of Patent: Jun. 24, 2008

(54) OUTPUT CIRCUIT

(75) Inventors: Kazumasa Akai, Ota (JP); Yukio Kin, Ota (JP); Tomoko Ishizuka, Gunma (JP)

(73) Assignee: SANYO Electric Co., Ltd., Osaka (JP)

( * ) Notice: Subject to any disclaimer, the term of this patent is extended or adjusted under 35 U.S.C. 154(b) by 188 days.

(21) Appl. No.: 11/179,775

(22) Filed: Jul. 13, 2005

(65) Prior Publication Data
US 2006/0012436 A1    Jan. 19, 2006

(30) Foreign Application Priority Data
Jul. 13, 2004    (JP)    ............................. 2004-206129

(51) Int. Cl.
*H03F 1/52*    (2006.01)
(52) U.S. Cl. .................................... 330/298; 330/207 P
(58) Field of Classification Search ............ 330/124 R, 330/207 P, 195, 298
See application file for complete search history.

(56) References Cited

U.S. PATENT DOCUMENTS 3,968,382 A * 7/1976 Tsurushima ................. 330/298
4,410,859 A * 10/1983 Kuwahara ................... 330/298

FOREIGN PATENT DOCUMENTS

JP    05-335493    12/1993
JP    2004-172634 A    6/2004

* cited by examiner

*Primary Examiner*—Khanh V Nguyen
(74) *Attorney, Agent, or Firm*—Morrison & Foerster LLP

(57) ABSTRACT

A patterning area of an output circuit is reduced while securing strong enough ESD tolerance. In the output circuit of this invention, an output of a first amplifier and an output of a second amplifier are connected to a common output pad. Each of the amplifiers is driven by each of signals $\Phi1$ and $\Phi2$ from an internal circuit, respectively. The first amplifier has larger driving capacity than the second amplifier. A high voltage side power supply terminal of the second amplifier is provided with a power supply voltage VDD from a power supply pad through a first protection resistor, while a low voltage side power supply terminal of the second amplifier is provided with a ground voltage VSS from a ground pad through a second protection resistor. And a third protection resistor is connected between an output of the second amplifier and an output terminal. The first, second and third protection resistors are made of metal wirings, and their resistance is preferably about $10\Omega$.

5 Claims, 6 Drawing Sheets

OUTPUT CIRCUIT

CROSS-REFERENCE OF THE INVENTION

This invention is based on Japanese Patent Application No. 2004-206129, the content of which is incorporated herein by reference in its entirety.

BACKGROUND OF THE INVENTION

1. Field of the Invention

This invention relates to an output circuit, specifically to an output circuit that includes at least two amplifiers.

2. Description of the Related Art

In general, ESD (Electrostatic Discharge) damage is caused in a MOS transistor when an excessive voltage due to an external noise is applied to it. Therefore, various protection measures are taken especially for a MOS transistor connected to an input or output terminal. In an output circuit shown in FIG. 8, an output of a first amplifier 1 and an output of a second amplifier 2 are connected to a common output pad (output terminal) P2. Each of the amplifiers 1 and 2 is driven by each of signals $\Phi 1$ and $\Phi 2$ from an internal circuit 3, respectively. The first amplifier 1 has a larger driving capacity than the second amplifier 2. Driving capacity of the combined amplifiers can be made variable by controlling the amplifiers so that either the first amplifier 1 or the second amplifier 2 is in operation, or both of the amplifiers 1 and 2 are in operation.

A high voltage side power supply terminal H1 of the first amplifier 1 is provided with a power supply voltage VDD from a power supply pad P1, while a low voltage side power supply terminal L1 of the first amplifier 1 is provided with a ground voltage VSS from a ground pad P3. Similarly, a high voltage side power supply terminal H2 of the second amplifier 2 is provided with the power supply voltage VDD from the power supply pad P1, while a low voltage side power supply terminal L2 of the second amplifier 2 is provided with the ground voltage VSS from the ground pad P3.

Each of the first amplifier 1 and the second amplifier 2 includes a CMOS inverter composed of a P-channel type MOS transistor and an N-channel type MOS transistor. The MOS transistors in the first amplifier 1 are designed to be larger in size (gate width GW) than the MOS transistors in the second amplifier 2, so that ON-resistance of the MOS transistors in the first amplifier 1 is lower than that in the second amplifier 2.

Also, in order to prevent ESD damage on the MOS transistors by an external noise applied to the power supply pad P1, the output pad P2 or the ground pad P3, a size of a contact hole of the MOS transistor connected directly to each of the pads, a distance between the contact hole and the gate, a gate length and a distance between a back gate and a source or a drain in both of the first and second amplifiers are designed to be of considerably larger sizes (ESD protection design rules) than minimum sizes according to design rules applied.

Further information related to the technologies described above is disclosed in Japanese Patent Application Publication No. H05-335493, for example.

However, designing both the first amplifier 1 and the second amplifier 2 to the ESD protection design rules results in increased sizes of the MOS transistors that constitute the amplifiers, and causes a problem of larger die size of the LSI (Large Scale Integration) in which the amplifiers are included.

SUMMARY OF THE INVENTION

The invention provides an output circuit that includes a first amplifier having a first transistor and a second amplifier having a second transistor and having less driving capacity than the first amplifier. The second amplifier further includes an output terminal, a high voltage side power supply terminal and a low voltage side power supply terminal. The output circuit further includes a protection resistor connected with the output terminal, the high voltage side power supply terminal or the low voltage side power supply terminal. The first transistor is larger than the second transistor.

DETAILED DESCRIPTION OF THE INVENTION

Figure 1:
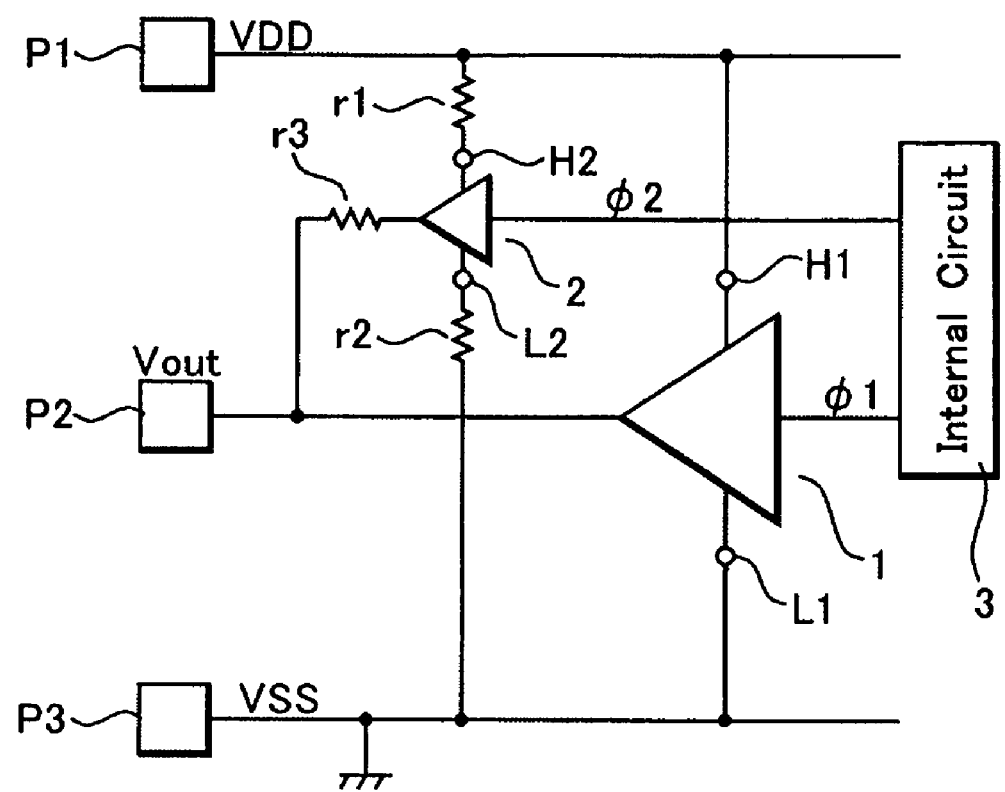
FIG. 1 is a circuit diagram of an output circuit according to a first embodiment of this invention.

Next, an output circuit according to a first embodiment of this invention will be explained referring to FIG. 1. In the output circuit, an output of a first amplifier 1 and an output of a second amplifier 2 are connected to a common output pad (output terminal) P2. Each of the amplifiers 1 and 2 is driven by each of signals $\Phi 1$ and $\Phi 2$ from an internal circuit 3, respectively. The first amplifier 1 has a larger driving capacity than the second amplifier 2. Driving capacity of the combined amplifiers can be made variable by controlling the amplifiers so that either the first amplifier 1 or the second amplifier 2 is in operation, or both of the amplifiers 1 and 2 are in operation.

A high voltage side power supply terminal H1 of the first amplifier 1 is provided with a power supply voltage VDD from a power supply pad P1, while a low voltage side power supply terminal L1 of the first amplifier 1 is provided with a ground voltage VSS from a ground pad P3. On the other hand, a high voltage side power supply terminal H2 of the second amplifier 2 is provided with a power supply voltage VDD from a power supply pad P1 through a first protection resistor r1, while a low voltage side power supply terminal L2 of the second amplifier 2 is provided with a ground voltage VSS from a ground pad P3 through a second protection resistor r2. And a third protection resistor r3 is connected between an output of the second amplifier 2 and an output pad P2. The first, second and third protection resistors r1, r2 and r3 are made of metal wirings as will be described below, and their resistance is preferably about An external noise may be applied to any of the power supply pad P1, the output pad P2 and the ground pad P3. Each of the protection resistors r1, r2 and r3 works to protect the second amplifier 2. The first protection resistor r1 limits a noise current when the external noise is applied to the power supply pad P1. The second protection resistor r2 limits the noise current when the external noise is applied to the ground pad P3. The third protection resistor r3 limits the noise current when the external noise is applied to the output pad P2. Although providing one of the pads with one of the protection resistors still has some significant effect, it is preferable that each of the pads is provided with each of the protection resistors for better ESD protection against all potential external noises.

Figure 2A:
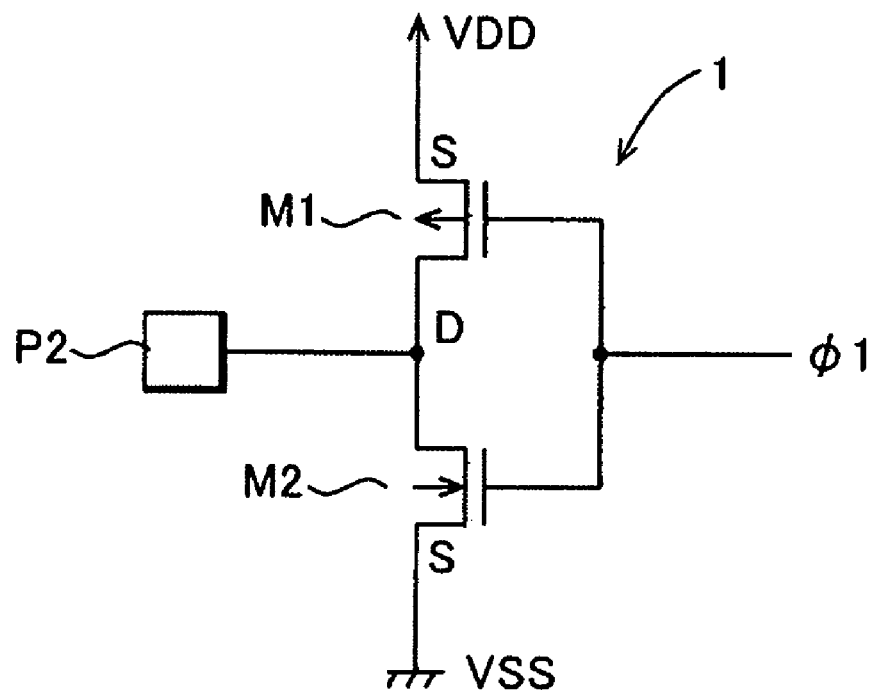
FIG. 2A is a circuit diagram of an output portion of a first amplifier according to the first embodiment of this invention.
Figure 2B:
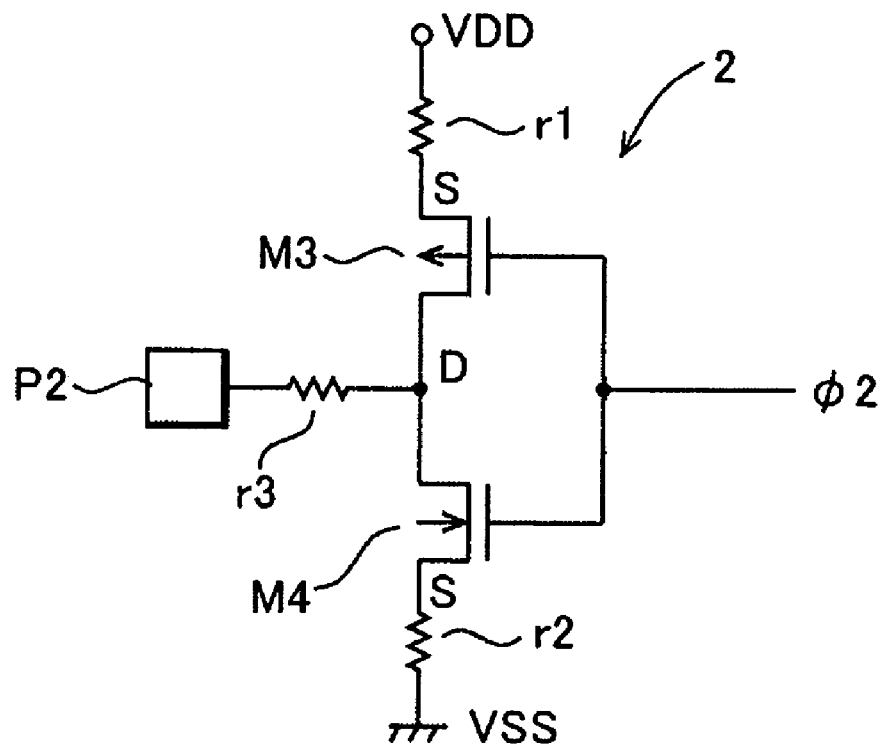
FIG. 2B is a circuit diagram of an output portion of a second amplifier according to the first embodiment of this invention.

Next, an example of concrete circuit structures of the first amplifier 1 and the second amplifier 2 according to the first embodiment of this invention will be explained referring to FIGS. 2A and 2B. FIG. 2A is a circuit diagram of an output portion of the first amplifier 1, while FIG. 2B is a circuit diagram of an output portion of the second amplifier 2.

The output portion of the first amplifier 1 is composed of a CMOS inverter that is made of a P-channel type MOS transistor M1 whose source is provided with the power supply voltage VDD from the power supply pad P1 and an N-channel type MOS transistor M2 whose source is provided with the ground voltage VSS from the ground pad P3. And a drain of the P-channel type MOS transistor M1 and a drain of the N-channel type MOS transistor M2 are connected together at a connecting node. The connecting node (i.e. the output terminal of the first amplifier 1) is connected to the output pad P2. The signal $\Phi 1$ is applied to a gate of the P-channel type MOS transistor M1 and a gate of the N-channel type MOS transistor M2.

The output portion of the second amplifier 2 is also composed of a CMOS inverter that is made of a P-channel type MOS transistor M3 whose source is provided with the power supply voltage VDD from the power supply pad P1 through the first protection resistor r1 and an N-channel type MOS transistor M4 whose source is provided with the ground voltage VSS from the ground pad P3 through the second protection resistor r2. And the third protection resistor r3 is connected between an output of the CMOS inverter and the output pad P2.

Figure 3A:
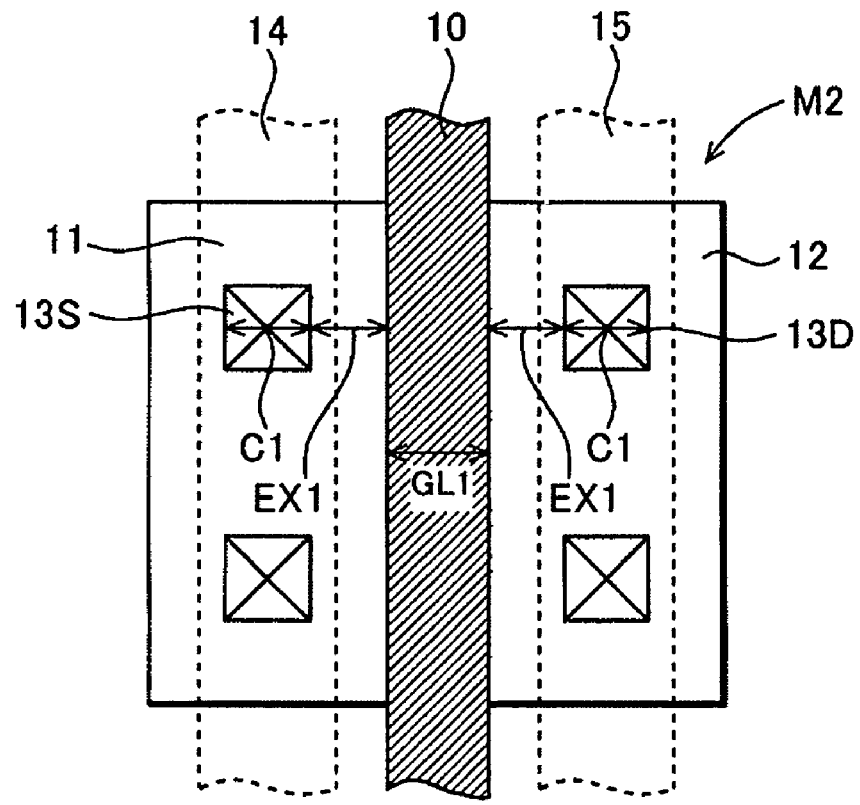
FIG. 3A is a layout pattern of an N-channel type MOS transistor constituting the first amplifier according to the first embodiment of this invention.
Figure 3B:
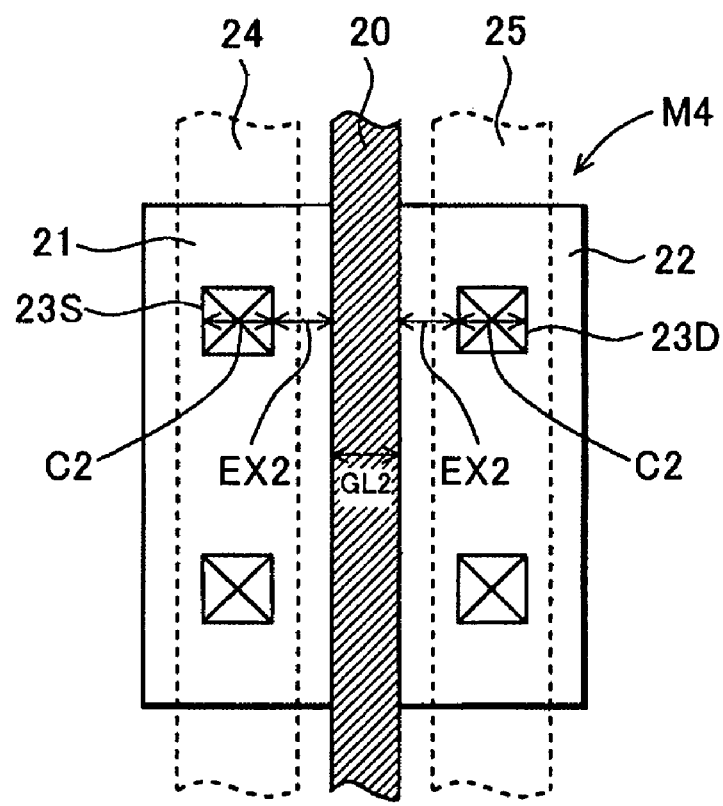
FIG. 3B is a layout pattern of an N-channel type MOS transistor constituting the second amplifier according to the first embodiment of this invention.

Next, layout patterns of the N-channel type MOS transistor M2 constituting the first amplifier 1 and the N-channel type MOS transistor M4 constituting the second amplifier 2 will be described referring to FIGS. 3A and 3B. FIG. 3A is a plan view of the N-channel type MOS transistor M2. FIG. 3B is a plan view of the N-channel type MOS transistor M4.

Each of contact holes 13S and 13D is disposed on each of the source 11 and the drain 12 of the N-channel type MOS transistor M2, respectively. The source 11 is electrically connected with a metal wiring 14 through the contact hole 13S, and the drain 12 is connected with a metal wiring 15 through the contact hole 13D. The N-channel type MOS transistor M2 is designed based on the ESD protection design rules and a gate length GL1 (1.2 μm, for example) of its gate 10, a spacing EX1 between the gate 10 and each of the contact holes 13S and 13D and a width C1 of each of the contact holes 13S and 13D are formed to be large. And a size (gate width GW) of the N-channel type MOS transistor M2 is designed as large as 7500 μm, for example, in order for the first amplifier 1 to have a large driving capacity.

Each of contact holes 23S and 23D is disposed on each of the source 21 and the drain 22 of the N-channel type MOS transistor M4 constituting the second amplifier 2, respectively. The source 21 is electrically connected with a metal wiring 24 through the contact hole 23S, and the drain 22 is connected with a metal wiring 25 through the contact hole 23D. The N-channel type MOS transistor M4 is designed not based on the ESD protection design rules but based on finer design rules, preferably minimum dimension design rules, and a gate length GL2 (0.8 μm, for example) of its gate 20, a spacing EX2 between the gate 20 and each of the contact holes 23S and 23D and a width C2 of each of the contact holes 23S and 23D are formed to be small. And a size (gate width GW) of the N-channel type MOS transistor M4 is designed as small as 20-30 μm, for example, because the driving capacity of the second amplifier 2 is smaller than that of the first amplifier 1.

Figure 4:
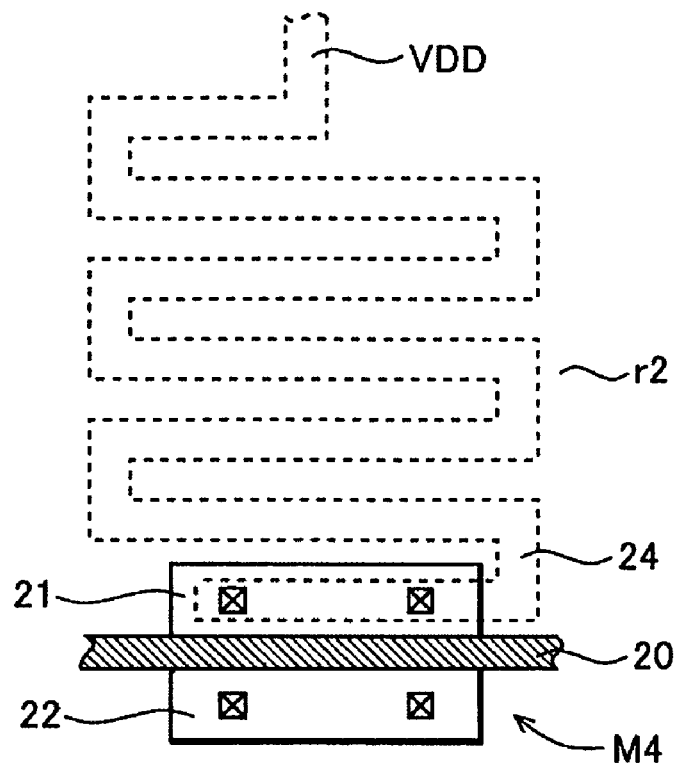
FIG. 4 is a layout pattern of the N-channel type MOS transistor constituting the second amplifier and a third protection resistor according to the first embodiment of this invention.

Similar correlation applies between the P-channel type MOS transistor M1 constituting the first amplifier 1 and the P-channel type MOS transistor M3 constituting the second amplifier 2. The metal wiring 24 connected to the source 21 of the N-channel type MOS transistor M4 extends over a semiconductor die forming the protection resistor r2 shaped in a zigzag pattern, as shown in FIG. 4. It is preferable that the first protection resistor r1 and the third protection resistor r3 are also formed of metal wirings shaped in zigzag patterns as the second protection resistor r2 to utilize unused space of the metal wiring layer in the LSI die.

According to the first embodiment, the first amplifier 1 is tolerant of ESD because it is designed to the ESD protection design rules, the second amplifier 2 can be made small in patterning area because it is designed to the finer design rules than the ESD protection design rules and in addition, the output circuit as a whole has high enough ESD tolerance because it is provided with the protection resistors. Since the driving capacity of the second amplifier 2 is smaller than the first amplifier, incorporating the protection resistors does not have much effect on its output impedance.

Figure 5:
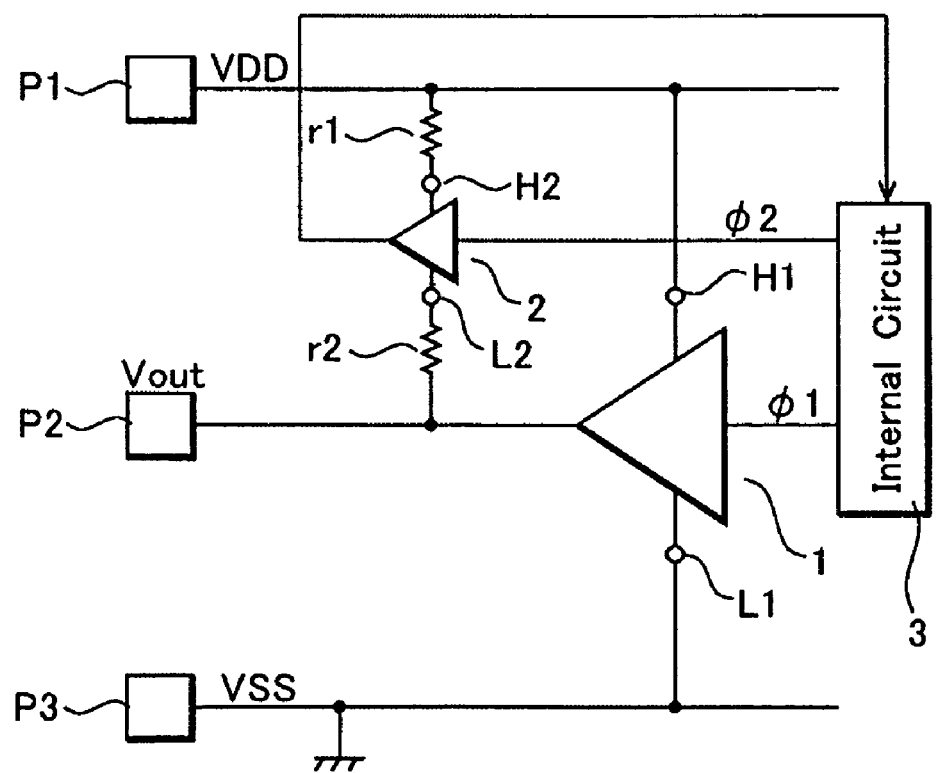
FIG. 5 is a circuit diagram of an output circuit according to a second embodiment of this invention.

Next, an output circuit according to a second embodiment of this invention will be explained referring to FIG. 5. An output of the a amplifier 1 is applied to a low voltage side power supply terminal L2 of a second amplifier 2 through a second protection resistor r2 in the output circuit. That is, the second amplifier 2 serves as a level shift circuit that converts an input signal $\Phi 2$ having amplitude between VDD and VSS into an output having amplitude between VDD and an output voltage Vout of the first amplifier 1. The output of the second amplifier 2 is inputted to an internal circuit 3. The other structural features are similar to the first embodiment.

Figure 6:
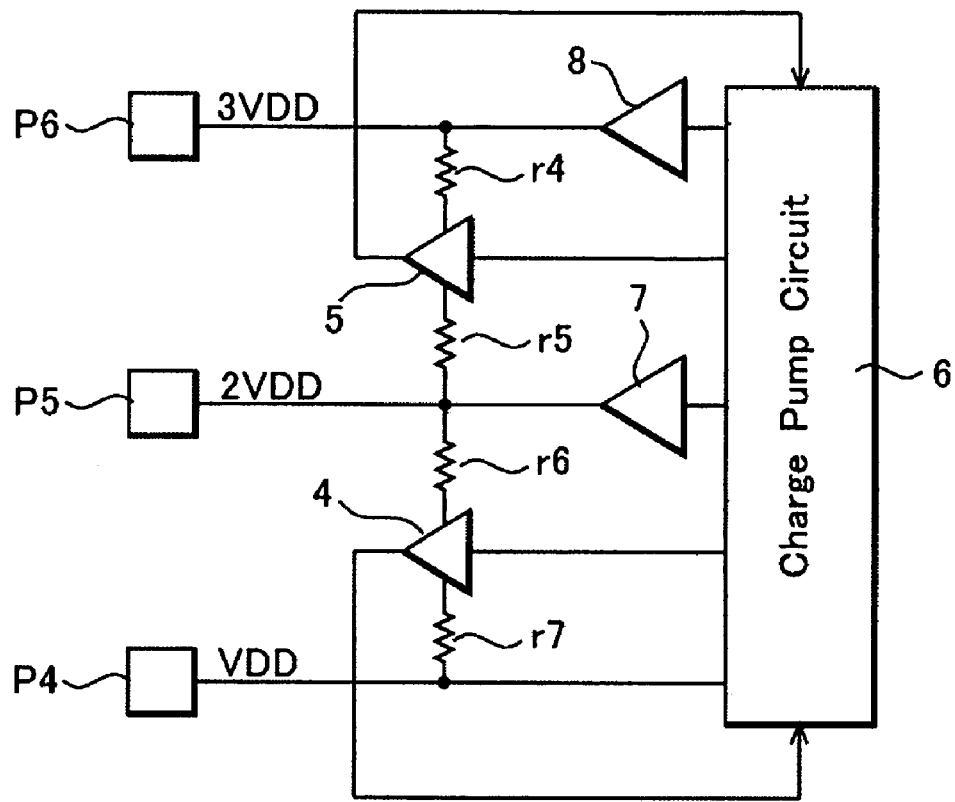
FIG. 6 is a circuit diagram of an output circuit according to a third embodiment of this invention.

Next, an output circuit according to a third embodiment of this invention will be explained referring to FIG. 6. A charge pump circuit 6 steps up the power supply voltage VDD supplied from a power supply pad P4, and outputs each of boosted voltages 2VDD and 3VDD to each of output pads P5 and P6 through each of amplifiers 7 and 8, respectively. Each of the amplifiers 7 and 8 has a structure corresponding to the first amplifier 1 in the first and second embodiments.

An output of a first level shift circuit 4 controls switching of a charge transfer MOS transistor in the charge pump circuit 6. The first level shift circuit 4 is provided with each of the voltages 2VDD and VDD through each of protection resistors r6 and r7, respectively, and has a structure corresponding to the second amplifier 2 in the first and second embodiments.

An output of a second level shift circuit 5 controls switching of another charge transfer MOS transistor in the charge pump circuit 6. The second level shift circuit 5 is provided with each of the voltages 3VDD and 2VDD through each of protection resistors r4 and r5, respectively, and has a structure corresponding to the second amplifier 2 in the first and second embodiments.

Figure 7:
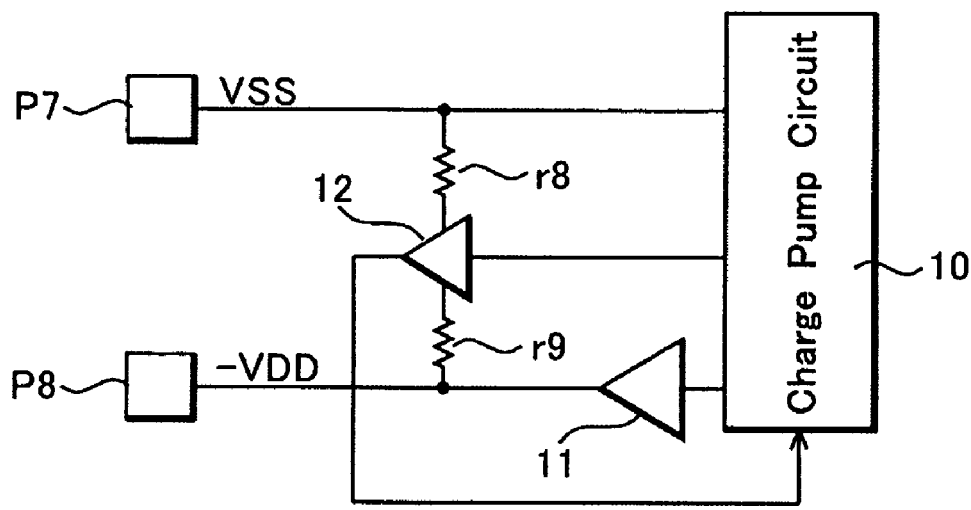
FIG. 7 is a circuit diagram of an output circuit according to a fourth embodiment of this invention.
Figure 8:
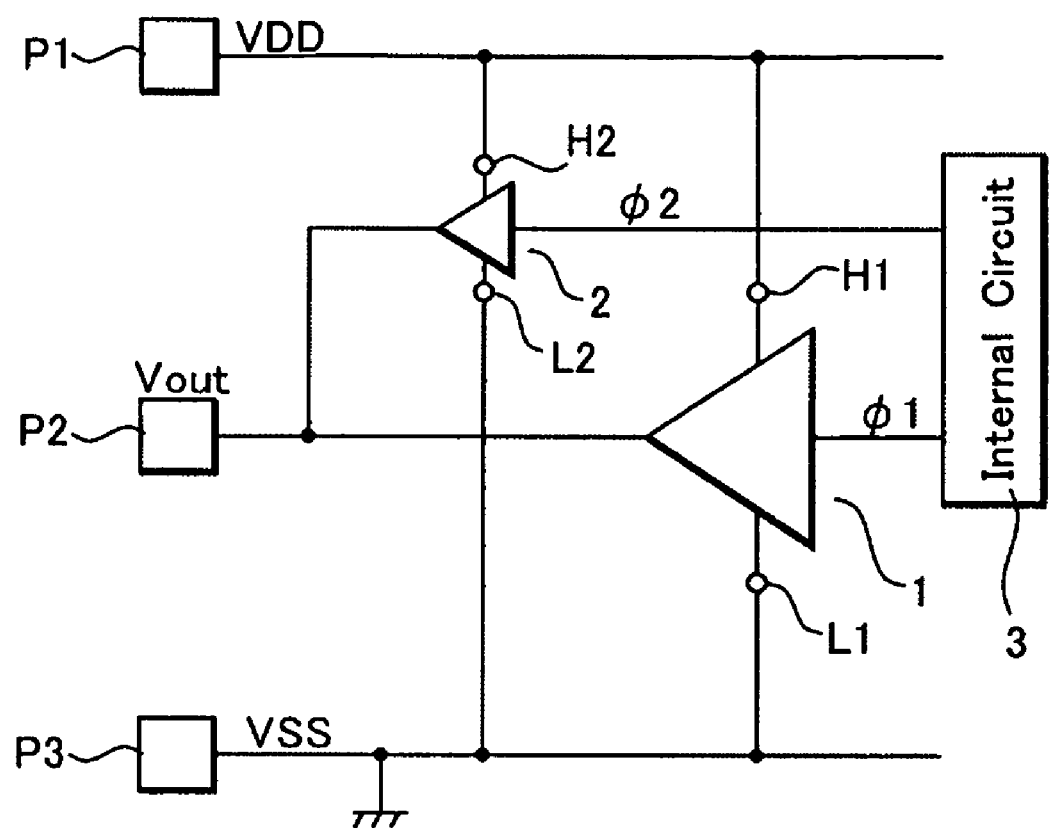
FIG. 8 is a circuit diagram of an output circuit according to a conventional art.

Next, an output circuit according to a fourth embodiment of this invention will be explained referring to FIG. 7. A charge pump circuit 10 is provided with the ground voltage VSS from a ground pad P7, and generates a negative voltage −VDD that is outputted to an output pad P8 through an amplifier 11. The amplifier 11 has a structure corresponding to the first amplifier 1 in the first and second embodiments. An output of a level shift circuit 12 controls switching of a charge transfer MOS transistor in the charge pump circuit 10. The level shift circuit 12 is provided with each of the voltages VSS and −VDD through each of protection resistors r8 and r9, respectively, and has a structure corresponding to the second amplifier 2 in the first and second embodiments.

In the embodiments described above, choosing one of following combinations of operational voltage features of MOS transistors (M1, M2, M3 and M4, for example) is preferable. A first combination is forming all MOS transistors in the first amplifier 1 and the second amplifier 2 with low operational voltage MOS transistors. A second combination is forming all MOS transistors in the first amplifier 1 and the second amplifier 2 with high operational voltage MOS transistors, which can operate under a voltage as high as 15-40 V. A third combination is forming MOS transistors in the first amplifier 1 with low operational voltage and forming MOS transistors in the second amplifier 2 with high operational voltage MOS transistors.

According to this invention, the second amplifier can be made small while securing strong enough ESD tolerance by designing the MOS transistors in the second amplifier based on design rules of smaller dimensions compared with the MOS transistors in the first amplifier and by connecting a protection resistor to at least one of three terminals of the second amplifier, that are the output terminal, the high voltage side power supply terminal and the low voltage side power supply terminal.

What is claimed is:

1. An output circuit comprising:
   a first amplifier comprising a first transistor;
   a second amplifier comprising a second transistor and having less driving capacity than the first amplifier, the second amplifier further comprising an output terminal, a high voltage side power supply terminal and a low voltage side power supply terminal; and
   a first protection resistor connected to the output terminal, a second protection resistor connected to the high voltage side power supply terminal and a third protection resistor connected to the low voltage side power supply terminal,
   wherein the first transistor is larger than the second transistor.

2. The output circuit of claim 1, further comprising an output terminal receiving an output of the first amplifier and an output of the second amplifier.

3. An output circuit comprising:
   a first amplifier comprising a first transistor;
   a second amplifier comprising a second transistor and having less driving capacity than the first amplifier, the second amplifier further comprising an output terminal, a high voltage side power supply terminal and a low voltage side power supply terminal; and
   a protection resistor connected to the output terminal, the high voltage side power supply terminal or the low voltage side power supply terminal,
   wherein the first transistor is larger than the second transistor, and an output of the second amplifier is configured to be supplied to an internal circuit of a semiconductor integrated circuit.

4. The output circuit of claim 3, wherein the second amplifier comprises a level shift circuit.

5. An output circuit comprising:
   a first amplifier comprising a first transistor;
   a second amplifier comprising a second transistor and having less driving capacity than the first amplifier, the second amplifier further comprising an output terminal, a high voltage side power supply terminal and a low voltage side power supply terminal;
   a protection resistor connected to the output terminal, the high voltage side power supply terminal or the low voltage side power supply terminal; and
   an additional protection resistor connected to one of the output terminal, the high voltage side power supply terminal and the low voltage side power supply terminal that is not connected to said protection resistor.

* * * * *